(12) United States Patent
Hamby et al.

(10) Patent No.: US 9,000,598 B1
(45) Date of Patent: Apr. 7, 2015

(54) ORIENTATION-INDEPENDENT DEVICE CONFIGURATION AND ASSEMBLY

(71) Applicants: David W. Hamby, Andover, MA (US); Adam M. Scotch, Amesbury, MA (US); Sridharan Venk, Salem, MA (US); Alan Lenef, Belmont, MA (US)

(72) Inventors: David W. Hamby, Andover, MA (US); Adam M. Scotch, Amesbury, MA (US); Sridharan Venk, Salem, MA (US); Alan Lenef, Belmont, MA (US)

(73) Assignee: OSRAM Sylvania Inc., Danvers, MA (US)

( * ) Notice: Subject to any disclaimer, the term of this patent is extended or adjusted under 35 U.S.C. 154(b) by 0 days.

(21) Appl. No.: 14/040,552

(22) Filed: Sep. 27, 2013

(51) Int. Cl.
| | |
|---|---|
| H01L 23/48 | (2006.01) |
| H01L 33/62 | (2010.01) |
| H01L 23/00 | (2006.01) |
| H01L 33/38 | (2010.01) |
| H05K 1/11 | (2006.01) |

(52) U.S. Cl.
CPC ............... *H01L 33/62* (2013.01); *H01L 24/83* (2013.01); *H01L 33/38* (2013.01); *H05K 1/111* (2013.01)

(58) Field of Classification Search
CPC ..... H01L 33/625; H01L 33/38; H01L 33/387; H01L 24/83
USPC ......... 438/108, 118, 119, 124, 125, 126, 127; 257/773, 776, 786
See application file for complete search history.

(56) References Cited

U.S. PATENT DOCUMENTS

| | | | |
|---|---|---|---|
| 7,473,933 B2 | 1/2009 | Yan | |
| 7,510,912 B2 * | 3/2009 | Caletka et al. | 438/122 |
| 7,774,929 B2 | 8/2010 | Jacobs | |
| 7,874,474 B2 | 1/2011 | Kim et al. | |
| 2002/0064902 A1 * | 5/2002 | Sayyah | 438/107 |
| 2008/0277677 A1 | 11/2008 | Kuo et al. | |

* cited by examiner

*Primary Examiner* — Kevin M Picardat
(74) *Attorney, Agent, or Firm* — Robert F. Clark

(57) ABSTRACT

The present disclosure is directed to orientation-independent device configuration and assembly. An electronic device may comprise conductive pads arranged concentrically on a surface of the device. The conductive pads on the device may mate with conductive pads in a device location in circuitry. Example conductive pads may include at least a first circular conductive pad and a second ring-shaped conductive pad arranged to concentrically surround the first conductive pad. The concentric arrangement of the conductive pads allows for orientation-independent placement of the device in the circuitry. In particular, the conductive pads of the device will mate correctly with the conductive pads of the circuitry regardless of variability in device orientation. In one embodiment, the device may also be configured for use with fluidic self-assembly (FSA). For example, a device housing may be manufactured with pockets that cause the device to attain neutral buoyancy during manufacture.

10 Claims, 6 Drawing Sheets

ORIENTATION-INDEPENDENT DEVICE CONFIGURATION AND ASSEMBLY

TECHNICAL FIELD

The present invention relates to electronic devices, and more specifically, to devices that may be populated into circuitry without concern as to a particular orientation for the device.

BACKGROUND

In a typical electronics manufacturing process, circuitry including, but not limited to, printed circuit boards, flexible substrates, packages such as multichip modules (MCM), etc. may be populated with electronic devices using pick-and-place operations. For example, the circuitry may be routed through machines equipped with vision systems for identifying device placement locations in the circuitry and manipulators configured to pick up devices from a supply location (e.g., rail, reel, etc.) and place the devices into the previously identified device locations. Pick-and-place manufacturing has been effective at least from the standpoint of accurately populating circuitry with a variety of devices at a speed substantially faster than manual device insertion.

However, applications are now emerging wherein circuitry may need to be populated with high volumes of the same device. For example, recent developments in light emitting diode (LED) technology have created substantial demand for LED-based light sources due to their high quality light, low power consumption and long life. Manufacturing large-scale lighting (e.g., for commercial or professional use) may involve populating circuitry with thousands of the same LED. While pick-and-place manufacturing can do the job, high machine time and upkeep costs, limited production speed, etc. for performing such simple/repetitive assembly can be prohibitive.

Electronic manufacturing methods better suited for high volume production are now in development. For example, fluidic self-assembly (FSA) is a manufacturing method that relies upon the wetting behavior of liquids (e.g., solder) to populate circuitry. For example, electronic components (e.g., LED dies) may be assembled by drawing a circuit substrate through an agitated liquid bath. The liquid bath may be heated above the melting point of solder that has been pre-printed on the circuit board. Due to the agitation, bond pads on the components may randomly contact the molten solder on the circuit substrate, at which point the solder provides enough wetting and lubrication for the components to naturally find their device locations (e.g., their minimum energy configuration). In particular, the wetting effect of the melted solder may cause conductive pads or bumps on the devices to be drawn to conductive pads in the device locations.

Regardless of the type of manufacturing used, device misorientation is a problem that continues to plague device manufacturers with delays due to rework, device malfunctions due to incorrectly attached components, etc. Existing electronic components are orientation-dependent in that their pin/pad layout requires the component to be populated into circuitry in a particular orientation for proper component operation. For correct orientation, pick-and-place manufacturing may rely upon the components being properly oriented in their carriers (e.g., tubes, reels, etc.). However, devices are often incorrectly oriented in their carriers due to, for example, packaging errors, movement during shipment, etc. FSA manufacturing is even more problematic in regard to device orientation in that during population in FSA there is little control for device orientation.

BRIEF DESCRIPTION OF THE DRAWINGS

Reference should be made to the following detailed description which should be read in conjunction with the following figures, wherein like numerals represent like parts.

Figure 1:
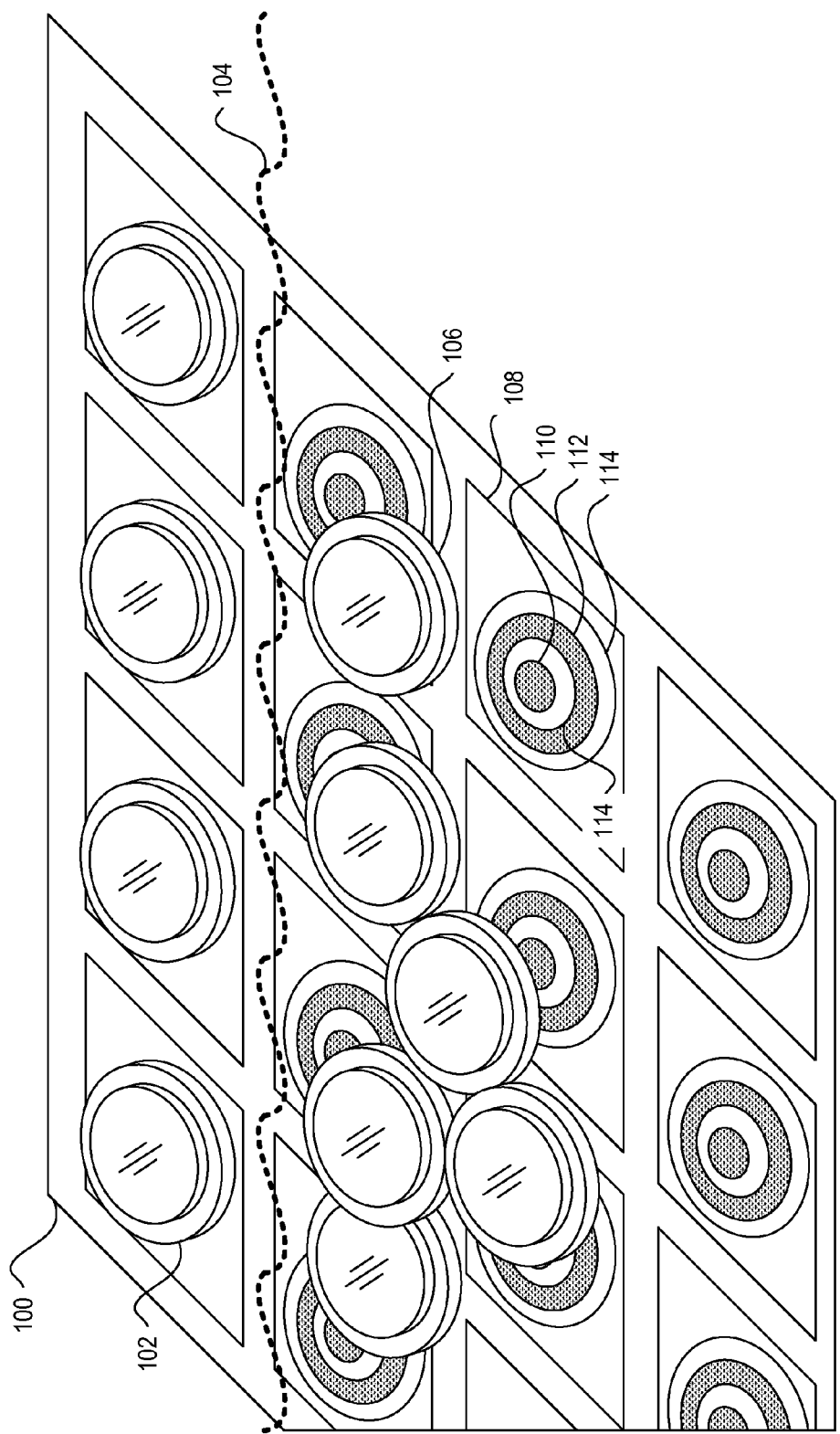
FIG. 1 illustrates example orientation-independent device configuration and assembly consistent with the present disclosure.

Although the following Detailed Description will proceed with reference being made to illustrative embodiments, many alternatives, modifications and variations thereof will be apparent to those skilled in the art.

DETAILED DESCRIPTION

As referenced herein, "circuitry" may comprise any substrate onto which electronic devices may be inserted, placed, populated, etc. Examples of circuitry may include, but are not limited to, circuit boards, flexible substrates, packages such as multichip modules (MCM), etc. Device orientation, as referenced herein, may pertain to the orientation of a device with respect to a desired orientation dictated by a device location on a substrate into which the device is being populated (e.g., during the manufacture of circuitry). In some instances, conductive pads on the device may still mate with conductive pads in a device location even when the device orientation is twisted out of proper alignment. In traditional electronic devices, this situation may result in incorrect conductive pad coupling, and without correction, malfunction of the device/circuitry.

Embodiments consistent with the present disclosure may include an electronic device with conductive pads arranged concentrically on a surface of the device. The conductive pads on the device may mate with conductive pads in a device location in circuitry. Example conductive pads may include at least a first circular conductive pad and a second ring-shaped conductive pad arranged to concentrically surround the first conductive pad. The concentric arrangement of the conductive pads allows for orientation-independent placement of the device in the circuitry. In particular, the conductive pads of the device will mate correctly with the conductive pads of the circuitry regardless of variability in device orientation. In one embodiment, the device may also be configured for use with fluidic self-assembly (FSA). For example, a device housing may be manufactured with pockets that cause the device to attain neutral buoyancy during manufacture.

In one embodiment, a device may comprise, for example, a device housing, at least one electronic component and conductive pads. The at least one electronic component may be enclosed within the device housing. The conductive pads may be structurally coupled to the device housing and electronically coupled to the at least one electronic component. Consistent with the present disclosure, the conductive pads may be arranged concentrically on the device.

The conductive pads may comprise, for example, at least a first conductive pad and a second conductive pad. The first conductive pad may be circular in shape, while the second conductive pad may be ring-shaped and arranged to concentrically surround the first conductive pad. The first conductive pad may be electronically isolated from the second conductive pad by at least one of an air gap or an insulator. In one example configuration, the first conductive pad may further have a surface area larger than a surface area of the second conductive pad.

In one embodiment, the first conductive pad may be electronically coupled to a first terminal on the at least one electronic component and the second conductive pad is electronically coupled to a second terminal on the at least one electronic component. For example, at least one of the first conductive pad may be electronically coupled to the first terminal by a wire bond or the second conductive pad may be electronically coupled to the second terminal by a wire bond. Alternatively, at least one of the first conductive pad may be electronically coupled to the first terminal by direct die attachment or the second conductive pad may be electronically coupled to the second terminal by direct die attachment. It is also possible for the first conductive pad to be electronically coupled to the first terminal by direct die attachment and the second conductive pad to be electronically coupled to the second terminal by a wire bond. In at least one example implementation, the at least one electronic component is a light emitting diode (LED), the first terminal is a cathode and the second terminal is an anode.

In one example implementation, the device may be for use in a fluidic self-assembly (FSA) manufacturing process. For example, the housing may comprise gas pockets formed in the housing to allow the device to attain neutral buoyancy during the FSA manufacturing process. The gas pockets may be formed by outgassing during manufacture of the housing. Embodiments consistent with the present disclosure may further comprise circuitry including a substrate having at least one device location into which a device is populated during manufacture of the circuitry. The at least one device location may include conductive pads structurally coupled to the substrate and electrically coupled to at least one circuit path in the substrate. The conductive pads may be arranged concentrically on the substrate. For example, the conductive pads may comprise at least a first conductive pad and a second conductive pad, the first conductive pad being circular in shape and the second conductive pad being ring-shaped and arranged to concentrically surround the first conductive pad. The first conductive pad may be electronically isolated from the second conductive pad by at least one of an air gap or an insulator. In one example configuration, the first conductive pad may also have a surface area larger than a surface area of the second conductive pad. The circuitry may further comprise a device populated into the at least one device location, the device including at least two conductive pads smaller in size than the first and second conductive pads and arranged to at least electrically couple to the first and second conductive pads. An example method consistent with the present disclosure may comprise populating circuitry with at least one device, the at least one device comprising conductive pads arranged concentrically on a surface of the at least one device to mate with conductive pads arranged concentrically at a device location in the circuitry and affixing the at least one device to the circuitry.

FIG. 1 illustrates an example orientation-independent device configuration and assembly consistent with the present disclosure. Initially, it is important to recognize that the example illustrated in FIG. 1 is merely for the sake of explanation herein, and is not intended to limit any embodiments of the present disclosure to a required implementation. Various embodiments of the present disclosure may employ alternative materials, layouts, manufacturing processes, etc. and still be considered within the scope of the systems, methods, teachings, etc. disclosed herein.

FIG. 1 discloses circuitry 100 onto which devices 102 are being populated. Devices 102 are disclosed as light emitting diodes (LEDs), but may be any electronic device populated into circuitry 100. In FIG. 1, circuitry 100 may be populated with devices 102 through an FSA manufacturing process. However, other manufacturing processes are also usable including, for example, a pick-and-place manufacturing process. In an example FSA manufacturing process, circuitry 100 (e.g., a substrate including at least one device location 108) may be submerged in liquid 104 also containing loose devices 106. Liquid 104 may then be agitated to help facilitate moving loose devices 106 to device locations 108 in circuitry 100, and may be heated to melt solder previously applied to conductive pads 110 and 112 in device locations 108. While only two conductive pads 110 and 112 are illustrated in the example of FIG. 1, additional conductive pads may be included as necessary (e.g., based on the pin out of device 102, etc.). For example, first conductive pad 110 may be circular in shape, and second conductive pad 112 may be ring-shaped and arranged to concentrically surround first conductive pad 110. First conductive pad 110 may also be electronically isolated from second conductive pad 112 by insulators 114 (e.g., air gaps, ring-shaped insulating material, etc.). As circuitry 100 is withdrawn from liquid 104, the conductive pads of loose devices 106 may adhere to the molten solder on conductive pads 110 and 112 (e.g. via wetting), and thus, loose devices 106 may become populated devices 102.

However, as loose devices 106 float freely in agitated liquid 104 their orientation may change frequently. The conductive pad layouts in existing electronic devices may be sensitive to orientation change. In particular, there may be only one orientation allowing the conductive pads in a device to mate correctly to corresponding conductive pads 110 and 112. The probability of incorrect device orientation in circuitry 100, especially in FSA where there is little or no control over the orientation of device 106 prior to placement, becomes extremely problematic from the standpoint of the need for rework and/or the possibility for malfunction if incorrectly placed devices are not corrected.

Embodiments consistent with the present disclosure help to remedy this situation by providing an orientation-independent mounting system. Since conductive pads 110 and 112 are arranged concentrically on a surface of device 102, twisting device 102 in either direction about the central concentric axis will not change how the conductive pads on device 102 make contact with conductive pads 110 and 112 in circuitry 100. Eliminating the need to be aware of device orientation reduces the sensitivity involved when populating circuitry 100, and may increase the overall speed of manufacturing processes, be it pick-and-place, FSA or even manual assembly.

Figure 2:
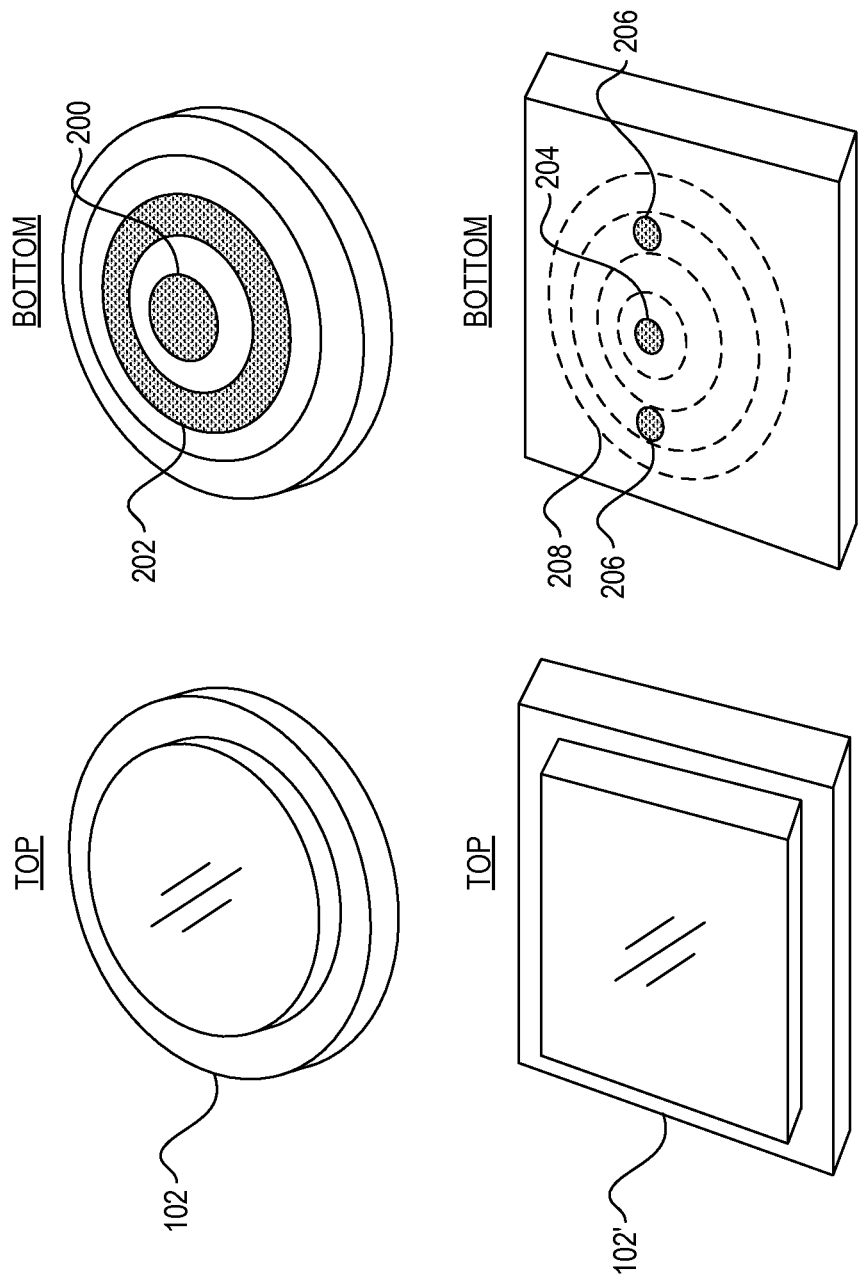
FIG. 2 illustrates example orientation-independent device housing configurations consistent with the present disclosure.

FIG. 2 illustrates example orientation-independent device housing configurations consistent with the present disclosure. As illustrated by the top view, device 102 may comprise, for example, an LED including a circular housing and lens similar to example devices 102 in FIG. 1. Further detail is provided in the bottom view of device 102 wherein a similar conductive pad arrangement including conductors 200 and 202 may be employed to mate with conductive pads 110 and 112 in device location 108 as disclosed in FIG. 1. During device placement, conductive pad 200 may be coupled to first conductive pad 110 in device location 108 while conductive pad 202 may be coupled to second conductive pad 112 in device location 108.

Moreover, other configurations are possible consistent with the present disclosure. For example, device 102' presents another example LED with a rectangular housing and lens. Device 102' demonstrates that the shape of the housing may be variable without affecting the conductive pad arrangement. An alternative conductive pad arrangement is shown for device 102' wherein smaller conductive pads 204 and 206 are employed to mate with the previously presented conductive pad arrangement shown in silhouette on device 102' at 208. Conductive pads 204 and 206 in device 102' may mate to conductive pads 110 and 112, respectively, at device location 108. The configuration may also be reversed with the smaller conductive pads being utilized at device location 108 and fully concentric conductive pads being employed on device 102'. At least one advantage of the conductive pad arrangement illustrated for device 102' is that orientation-independence may still be possible with smaller conductive pads 204 and 206. Utilizing smaller conductive pads 204 and 206 may, for example, make orientation-independent placement possible for devices with smaller housings, may yield more cost-effective devices, etc.

Figure 3:
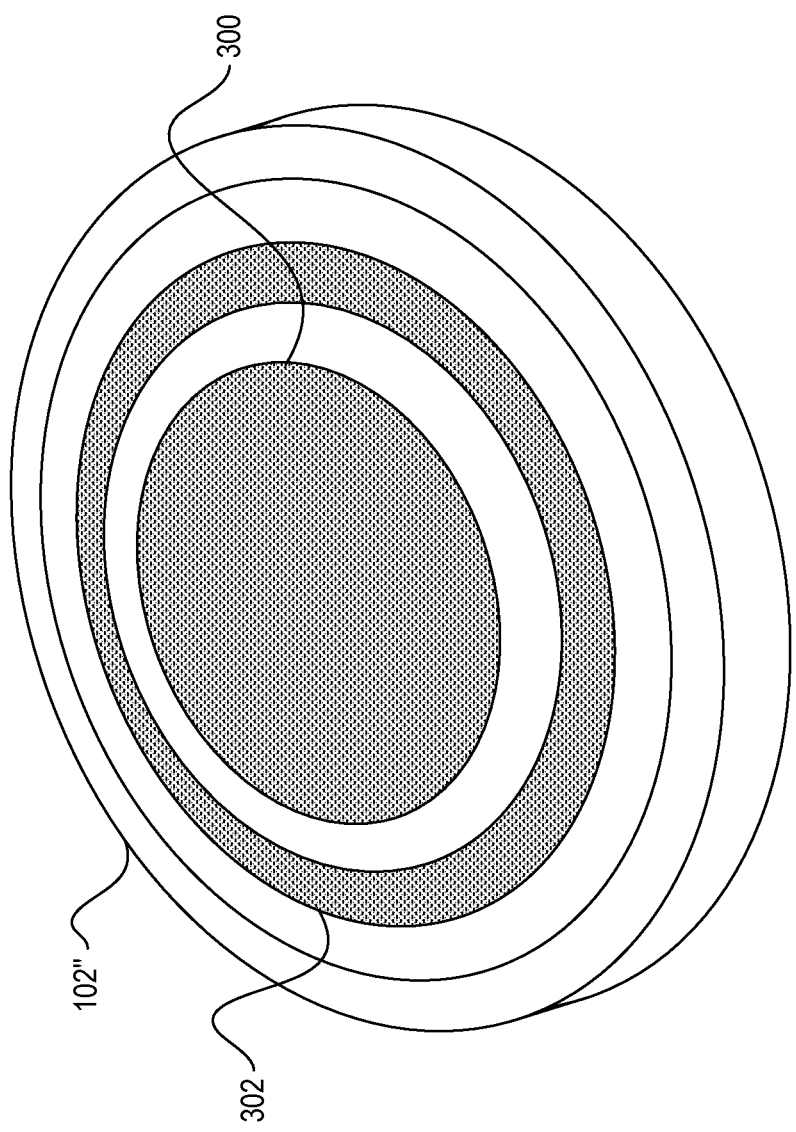
FIG. 3 illustrates an example conductive pad arrangement consistent with the present disclosure.

FIG. 3 illustrates an example conductive pad arrangement consistent with the present disclosure. Device 102" may comprise a first conductive pad 300 having a significantly larger surface area than a second conductive pad 302. First conductive pad 300 having a significantly larger area may help with component centering during circuit assembly. For example, during an FSA assembly process the larger first conductive pad 300 may facilitate device 102" to naturally find proper seating in device location 108 (e.g., via the wetting provided by the liquefied solder). In instances where device 102" is an LED, the enlarged surface area of first conductive pad 300 may also help to improve the operation of device 102" (e.g., thermal dissipation may increase in device 102" due to heat transferring through the large surface area provided by first conductive pad 300).

Figure 4:
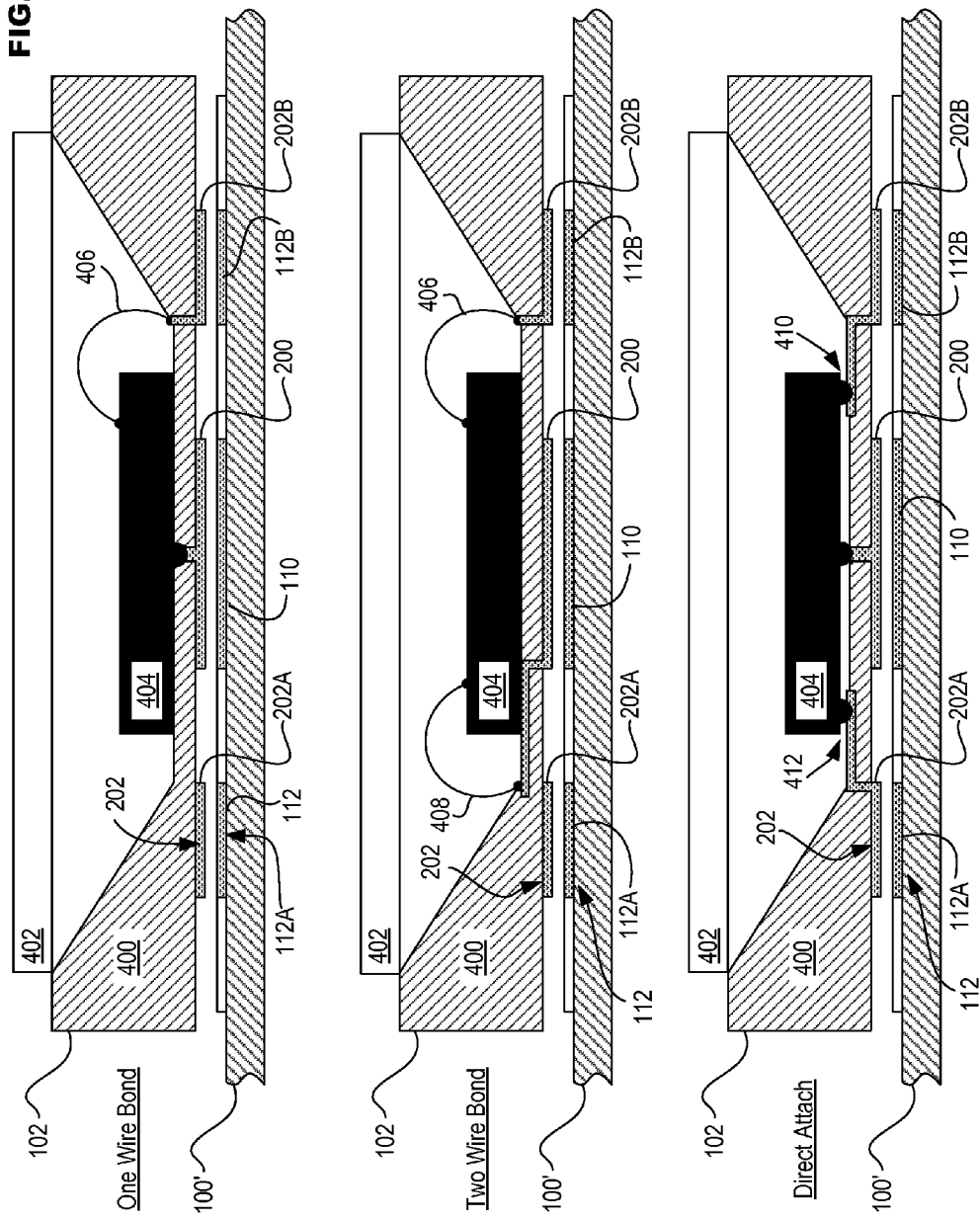
FIG. 4 illustrates example orientation-independent device electronics configurations consistent with the present disclosure.

FIG. 4 illustrates in cross section example orientation-independent device electronics configurations consistent with the present disclosure. Exampled device 102 may comprise a housing 400, lens 402 and electronic component 404 (e.g., an integrated circuit, chip, die, etc.). Conductive pads 200 and 202 (e.g., including 202A and 202B representing different sides of the same conductive pad 202) may be structurally coupled to housing 400 and electronically coupled to conductive pads 200 and 202. During population of circuitry 100', conductive pad 200 may be coupled to conductive pad 110 and conductive pads 202 (including 202A and 202B) may be coupled to conductive pad 112 (e.g., including 112A and 112B representing different sides of the same conductive pad 112).

In the "one wire bond" example illustrated in FIG. 4, electronic component 404 may be electronically coupled to conductive pad 200 via direct die attach and to conductive pad 202 via wire bond 406. Since conductive pads 202A and 202B are in actuality different sides of the same conductive pad 202, a single wire bond may suffice for the coupling.

A "two wire bond" example in FIG. 4, discloses an additional wire bond 408 between electronic component 404 and conduction pad 200 (e.g., replacing the direct die attach to conduction pad 200 as shown in the one wire bond). A third "direct attach" example replaces the wire bonds with direct die attachments to pad 202 (202B and 202A) as shown at 410 and 412. The choice of whether to use direct die attach or wire bonding may depend on, for example, the type of electronic component 404, device 102, circuitry 100', etc.

Figure 5:
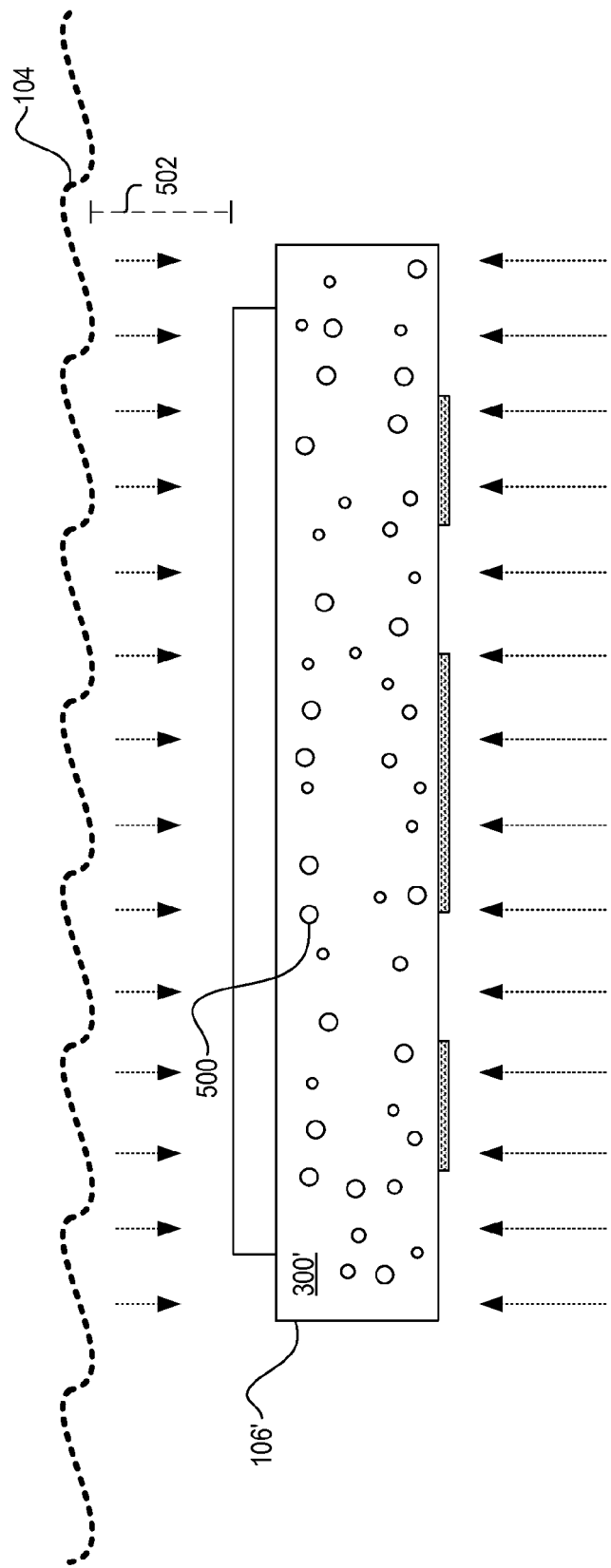
FIG. 5 illustrates an alternative example housing configuration consistent with the present disclosure.

FIG. 5 illustrates an alternative example housing configuration consistent with the present disclosure. Device 106' may comprise a housing 300' in which gas pockets 500 are formed (e.g., during the manufacture of device 106'). For example, volatile components may be added to the plastic prior to molding the device, causing housing 300' to outgas during device manufacture (e.g., during molding, reaction, curing, etc.). One example of material that may be employed in housing 300' is microcellular polyethylene terephthalate (MCPET). Gas pockets 500 may allow device 106' to attain neutral buoyancy in fluid 104 as shown at 502 (e.g., during an FSA manufacturing process). FSA schemes that involve sweeping of devices 106' onto a roll-to-roll flexible substrate may only require two-dimensional (2-D) agitation along the surface of the fluid 104 rather than three-dimensional (3-D) agitation in the liquid volume to induce self-assembly onto a substrate. This improvement may greatly reduce assembly time during FSA.

Figure 6:
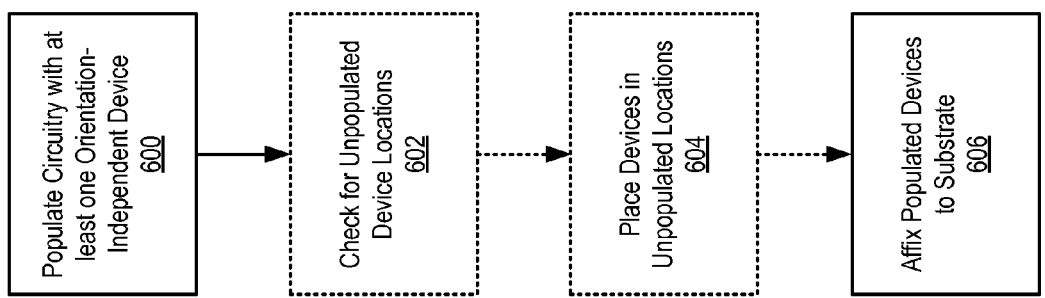
FIG. 6 illustrates example operations associated with orientation-independent device configuration and assembly consistent with the present disclosure.

FIG. 6 illustrates example operations associated with orientation-independent device configuration and assembly consistent with the present disclosure. In operation 600, circuitry may be populated with at least one orientation independent device. Optional operations 602 and 604 may then be performed based on, for example, the need for error checking in the circuitry. For example, in a large panel LED light source it may be possible for some device locations to be left unpopulated without substantially affecting the operation of the light source. Thus, the occasional missing LED may not be noticeable to someone viewing the light source. However, in circuitry wherein having all devices being placed is essential, operations 602 and 604 may be necessary. In operation 602 a check for unpopulated device locations may be performed, and if any unpopulated locations are discovered, in operation 604 these empty device locations may be populated via automated or manual rework operations. In operation 606 the populated devices may then be permanently affixed to the device locations. For example, reflow, epoxy curing or another attachment process may be performed to affix placed devices into their device locations.

While FIG. 6 illustrates various operations according to an embodiment, it is to be understood that not all of the operations depicted in FIG. 6 are necessary for other embodiments. Indeed, it is fully contemplated herein that in other embodiments of the present disclosure, the operations depicted in FIG. 6, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

The terms "electronically coupled," "electrically coupled," and the like as used herein refers to any connection, coupling, link or the like by which electrical signals and/or power carried by one system element are imparted to the "coupled" element. Such "electronically coupled" devices, or signals and devices, are not necessarily directly connected to one another and may be separated by intermediate components or devices that may manipulate or modify such signals. Likewise, the terms "connected" or "coupled" as used herein in regard to mechanical or physical connections or couplings is a relative term and does not require a direct physical connection.

The present disclosure is directed to orientation-independent device configuration and assembly. An electronic device may comprise conductive pads arranged concentrically on a surface of the device. The conductive pads on the device may mate with conductive pads in a device location in circuitry. Example conductive pads may include at least a first circular conductive pad and a second ring-shaped conductive pad arranged to concentrically surround the first conductive pad. The concentric arrangement of the conductive pads allows for orientation-independent placement of the device in the circuitry. In particular, the conductive pads of the device will mate correctly with the conductive pads of the circuitry regardless of variability in device orientation. In one embodiment, the device may also be configured for use with fluidic self-assembly (FSA). For example, a device housing may be manufactured with pockets that cause the device to attain neutral buoyancy during manufacture.

The following examples pertain to further embodiments. According to one aspect there is provided a device. The device may comprise a device housing, at least one electronic component enclosed within the device housing and conductive pads structurally coupled to the device housing and electronically coupled to the at least one electronic component, the conductive pads being arranged concentrically on the device.

According to another aspect there is provided circuitry. The circuitry may comprise a substrate including at least one device location into which a device is populated during manufacture of the circuitry, the at least one device location including conductive pads structurally coupled to the substrate and electrically coupled to at least one circuit path in the substrate, the conductive pads being arranged concentrically on the substrate.

According to another aspect there is provided a method. The method may comprise populating circuitry with at least one device, the at least one device comprising conductive pads arranged concentrically on a surface of the at least one device to mate with conductive pads arranged concentrically at a device location in the circuitry and affixing the at least one device to the circuitry.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A device, comprising:
a device housing;
at least one electronic component enclosed within the device housing; and
conductive pads structurally coupled to the device housing and electronically coupled to the at least one electronic component, the conductive pads being arranged concentrically on the device, the housing comprising gas pockets formed in the housing to allow the device to attain neutral buoyancy in a fluidic self-assembly manufacturing process.

2. The device according to claim 1, wherein the conductive pads comprise at least a first conductive pad and a second conductive pad, the first conductive pad being circular in shape and the second conductive pad being ring-shaped and arranged to concentrically surround the first conductive pad.

3. The device according to claim 2, wherein the first conductive pad is electronically isolated from the second conductive pad by at least one of an air gap or an insulator.

4. The device according to claim 2, wherein the first conductive pad has a surface area larger than a surface area of the second conductive pad.

5. The device according to claim 2, wherein the first conductive pad is electronically coupled to a first terminal on the at least one electronic component and the second conductive pad is electronically coupled to a second terminal on the at least one electronic component.

6. The device according to claim 5, wherein at least one of the first conductive pad is electronically coupled to the first terminal by a wire bond or the second conductive pad is electronically coupled to the second terminal by a wire bond.

7. The device according to claim 5, wherein at least one of the first conductive pad is electronically coupled to the first terminal by direct die attachment or the second conductive pad is electronically coupled to the second terminal by direct die attachment.

8. The device according to claim 5, wherein the first conductive pad is electronically coupled to the first terminal by direct die attachment and the second conductive pad is electronically coupled to the second terminal by a wire bond.

9. The device according to claim 5, wherein the at least one electronic component is a light emitting diode (LED), the first terminal is a cathode and the second terminal is an anode.

10. The device according to claim 1, wherein the gas pockets are formed by outgassing during manufacture of the housing.

* * * * *